(12) United States Patent
Hayes et al.

(10) Patent No.: US 10,651,541 B1
(45) Date of Patent: May 12, 2020

(54) PACKAGE INTEGRATED WAVEGUIDE

(71) Applicant: NXP USA, INC., Austin, TX (US)

(72) Inventors: Scott M. Hayes, Chandler, AZ (US); Walter Parmon, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/287,226

(22) Filed: Feb. 27, 2019

(51) Int. Cl.
*H01L 23/52* (2006.01)
*H01Q 1/22* (2006.01)
*H01Q 13/18* (2006.01)
*H01L 23/31* (2006.01)
*H01L 21/56* (2006.01)
*H01L 23/66* (2006.01)

(52) U.S. Cl.
CPC .......... *H01Q 1/2283* (2013.01); *H01L 21/565* (2013.01); *H01L 23/315* (2013.01); *H01L 23/66* (2013.01); *H01Q 13/18* (2013.01); H01L 2223/6677 (2013.01)

(58) Field of Classification Search
CPC ...... H01L 21/565; H01L 23/66; H01L 23/315
USPC ........................................................ 257/773
See application file for complete search history.

(56) References Cited

U.S. PATENT DOCUMENTS

| 5,912,598 | A | 6/1999 | Stones et al. |
| 6,958,662 | B1 | 10/2005 | Salmela et al. |
| 7,276,987 | B2 | 10/2007 | Koriyama |
| 7,289,069 | B2 | 10/2007 | Ranta |
| 9,202,162 | B2* | 12/2015 | Gordon ............ G06K 19/07749 |
| 9,219,041 | B2 | 12/2015 | Elad et al. |
| 9,272,370 | B2* | 3/2016 | Finn ...................... H01Q 1/2225 |
| 9,356,352 | B2* | 5/2016 | Seok ........................ H01Q 9/04 |
| 9,548,255 | B1 | 1/2017 | Ge et al. |
| 9,743,885 | B1* | 8/2017 | Yao ....................... A61B 5/6821 |
| 10,103,447 | B2 | 10/2018 | Tong et al. |
| 2002/0114143 | A1 | 8/2002 | Morrison et al. |
| 2011/0180917 | A1 | 7/2011 | Tang |
| 2013/0062419 | A1* | 3/2013 | Finn ................. G06K 19/07718 235/492 |

OTHER PUBLICATIONS

U.S. Appl. No. 16/446,861, filed Jun. 20, 2019, entitled "Package Integrated Waveguide".
U.S. Appl. No. 16/524,596, filed Jul. 29, 2019, entitled "Method, System, and Apparatus for Forming Three-Dimensional Semiconductor Device Package With Waveguide".

* cited by examiner

*Primary Examiner* — Luan C Thai

(57) ABSTRACT

A method of manufacturing a packaged semiconductor device including forming an assembly by coupling a semiconductor die and an antenna by way of a substrate, contacting with a conformal structure at least a portion of a first surface of the antenna, and encapsulating the assembly with an encapsulant such that the at least a portion of the first surface of the antenna contacted by the conformal structure is not encapsulated with the encapsulant.

20 Claims, 14 Drawing Sheets

PACKAGE INTEGRATED WAVEGUIDE

BACKGROUND

Field

This disclosure relates generally to semiconductor device packaging, and more specifically, to a semiconductor device having a package integrated waveguide.

Related Art

Today, there is an increasing trend to include radar systems in vehicles such as automobiles, trucks, buses, and the like in order to provide a driver with enhanced awareness of objects around the driver's vehicle. As the vehicle approaches objects (e.g. other cars, pedestrians, and obstacles) or as objects approach the vehicle, a driver cannot always detect the object and perform intervention actions needed to avoid a collision with the object. An automotive radar system mounted on a vehicle can detect the presence of objects including other vehicles in proximity to the vehicle and provide the driver with timely information so that the driver can perform possible intervention actions. However, such automotive radar system can significantly impact the cost of the vehicle.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a packaged semiconductor device with integrated waveguide. An assembly formed with a semiconductor die coupled to an antenna by way of a substrate is partially encapsulated with an encapsulant. An air cavity in the encapsulant formed above the antenna is configured as a waveguide allowing for efficient propagation (e.g., transmit and/or receive) of radar (e.g., wwWave) signals. The waveguide can be augmented with an extended waveguide structure proving greater tuning capabilities for transmitting/receiving the radar signals. By integrating the waveguide into/onto the package, required application circuit board space is minimized and overall costs are significantly reduced.

FIGS. 1-4 illustrate, in simplified cross-sectional views, an example packaged semiconductor device with integrated waveguide 100 at various stages of manufacture in accordance with an embodiment.

Figure 1:
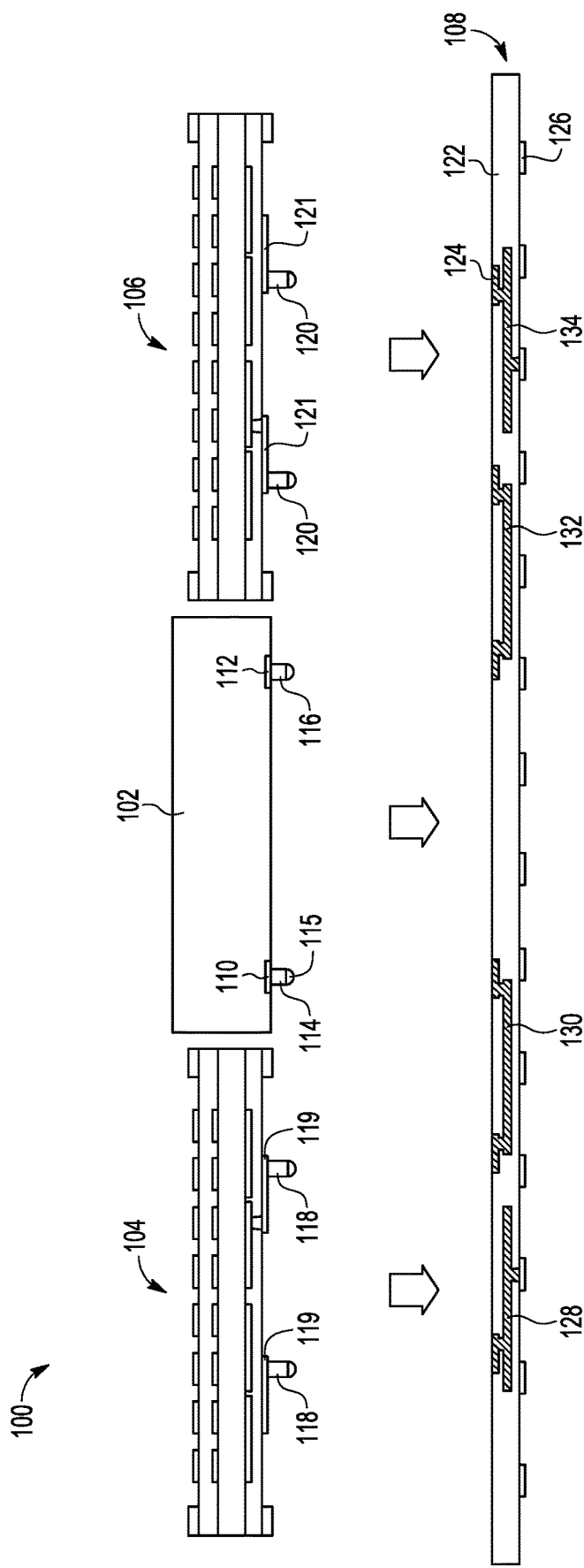
FIGS. 1-4 illustrate, in a simplified cross-sectional view, an example packaged semiconductor device with integrated waveguide at various stages of manufacture in accordance with an embodiment.

FIG. 1 illustrates, in a simplified cross-sectional view, a stage of manufacture of packaged semiconductor device 100, including a semiconductor die 102 and antennas 104-106 positioned over substrate 108 to form an assembly. In this example, the packaged semiconductor device 100 may be characterized as a signal processing transceiver device where one antenna is used for transmitting a signal and the other antenna is used for receiving a signal.

The semiconductor die 102 as depicted in FIG. 1 has an active surface (e.g., major surface having circuitry) and a backside surface (e.g., major surface opposite of the active surface). The semiconductor die 102 includes bond pads 110-112 at the active surface configured for connection to antennas 104-106 by way of substrate 108. In this embodiment, conductive pillars (e.g., copper pillars, nanotubes, solder bumps) 114-116 are employed to connect bond pads 110-112 to respective bond terminal pads on substrate 108. In some embodiments, a reflowable material (e.g., solder) 115 may cover at least a portion of the conductive pillars 114-116 to facilitate electrical connection to the substrate 108. The semiconductor die 102 may be formed from any suitable semiconductor material, such as silicon, germanium, gallium arsenide, gallium nitride and the like. Semiconductor die 102 may further include any digital circuits, analog circuits, RF circuits, memory, signal processor, MEMS, sensors, the like, and combination thereof.

As illustrated in FIG. 1, antennas 104-106 each have a first major surface (e.g., major surface positioned facing downward) and a second major surface (e.g., major surface opposite of the first major surface, positioned facing upward). Each of the antennas 104-106 includes terminals 119 and 121 respectively at the first major surface configured for connection to semiconductor die 102 by way of substrate 108. In this embodiment, conductive pillars 118 and 120 are employed to connect terminals 119 and 121 to respective bond terminal pads on substrate 108.

Substrate 108 is a pre-formed substrate including a redistribution layer. The substrate 108 includes an insulating material 122, bond terminal pads 124 located on a first major surface, ball terminal pads 126 located on a second major surface, and conductive traces 128-134 interconnecting bond terminal pads 124 and ball terminal pads 126. At this stage of manufacture, semiconductor die 102 and antennas 104-106 are affixed to substrate 108, forming the assembly. Conductive pillars 114, 116, 118, and 120 are used to form electrical connections between the semiconductor die 102, antennas 104-106, and substrate 108 of the assembly.

Figure 2:
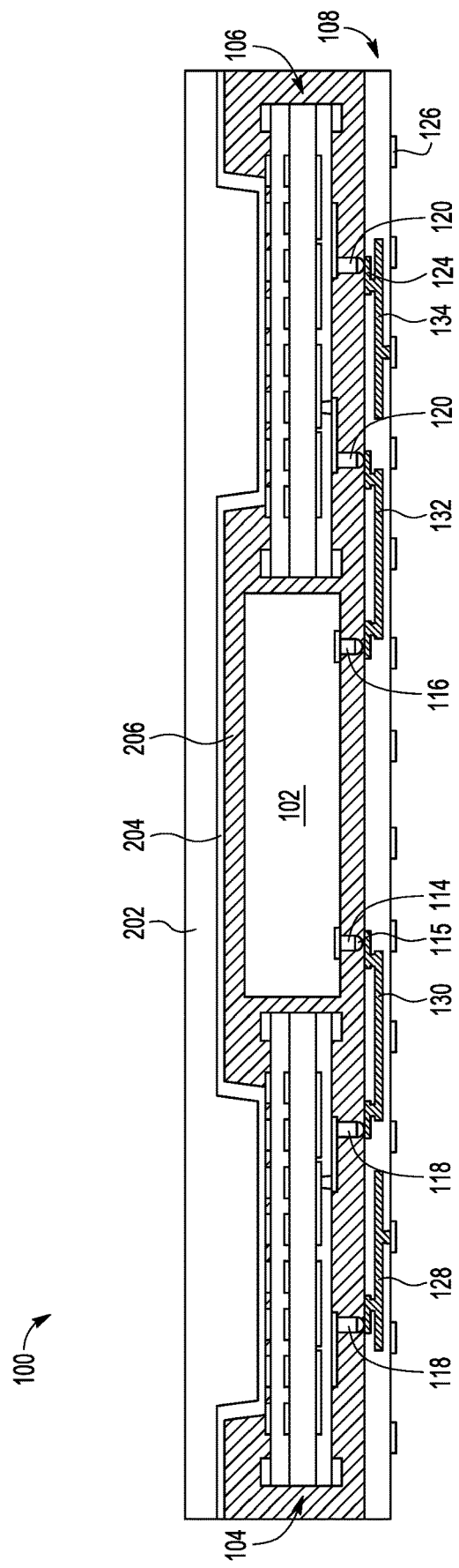

FIG. 2 illustrates, in a simplified cross-sectional view, a subsequent stage of manufacture of packaged semiconductor device 100, including the assembly of FIG. 1 partially encapsulated with an encapsulant (e.g., molding compound). At this stage, a film-assisted molding (FAM) tool 202 is in contact with a conformal structure (e.g., film) 204 over the assembly formed by the semiconductor die 102 and antennas 104-106 affixed to the substrate 108. The conformal structure 204 conforms with the shape of the FAM tool 202 and contacts predetermined portions of the second major surfaces of antennas 104-106. The encapsulant 206 is formed by substantially encapsulating the assembly with a molding compound, leaving the predetermined portions contacted by conformal structure exposed (e.g., not encapsulated).

Figure 3:
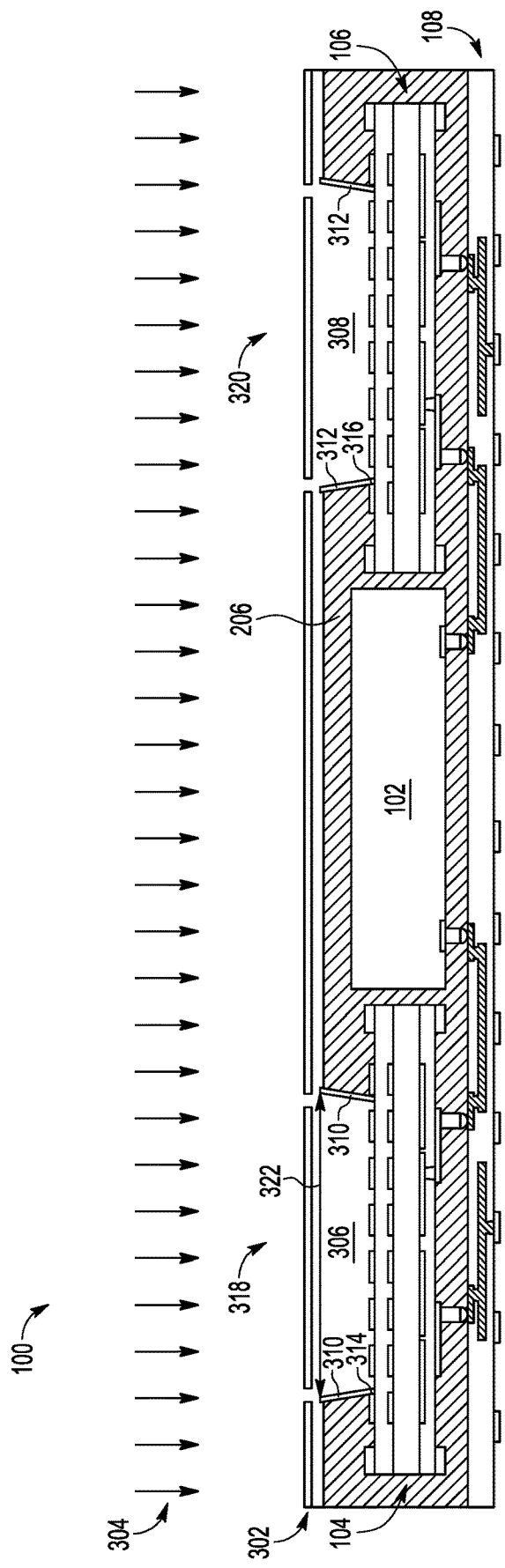

FIG. 3 illustrates, in a simplified cross-sectional view, a subsequent stage of manufacture of packaged semiconductor device 100, including the partially encapsulated assembly of FIG. 2. At this stage, the conformal structure is removed forming air cavities 306-308 configured as waveguides 318-320 above exposed portions of the second major surfaces of antennas 104-106. Waveguides 318-320 dimensions (e.g., width, length) may be configured for propagation of signals (e.g., radar signals 76-81 GHz) having desired wavelengths. For example, waveguide 318 may be configured for propagation (e.g., transmission) of a radar signal having a frequency of 77 GHz. Because a 77 GHz signal has a wavelength of approximately 4 mm, the waveguide 318 is configured having a width dimension 322 of approximately 2 mm, or half of the desired wavelength.

A conductive (e.g., metal or other conductive material) layer is formed on sidewalls 310 of air cavity 306 and sidewalls 312 of air cavity 308. The conductive layer formed on sidewalls 310-312 is coupled to supply terminals of the antennas 104-106 at junctions 314-316. In this embodiment, the conductive layer is a metal layer formed on sidewalls 310-312 is coupled to ground supply terminals of the antennas 104-106. In other embodiments, the conductive layer formed on sidewalls 310-312 maybe coupled to other supply terminals (e.g., operating voltage supply) of the antennas 104-106. A photolithographic process is employed in this embodiment using a mask 302 to isolate sidewalls of air cavities 306-308 and a deposition process is employed to sputter deposit 304 a conductive coating on the isolated sidewalls. In other embodiments, other techniques may be employed to form a conductive coating or layer on sidewalls of cavities 306-308.

Figure 4:
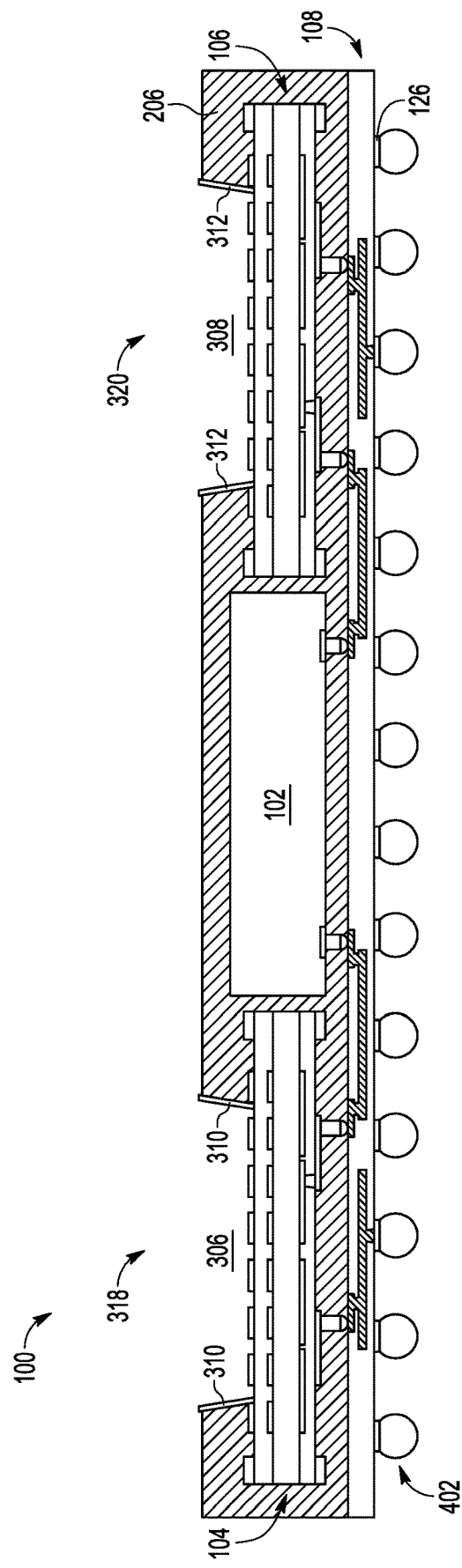

FIG. 4 illustrates, in a simplified cross-sectional view, a subsequent stage of manufacture of packaged semiconductor device 100, including attached conductive ball connectors (e.g., solder balls) 402. At this stage of manufacture, ball connectors 402 are affixed at ball terminal pads 126 using known techniques and materials. Alternatively, ball connectors 402 may be any suitable conductive structure such as gold studs, copper pillars, and the like, to electrically connect conductive features of packaged semiconductor device 100 with a printed circuit board, for example.

FIGS. 5-8 illustrate, in a simplified cross-sectional view, an example packaged semiconductor device 500 having an alternative substrate structure at various stages of manufacture in accordance with an embodiment.

Figure 5:
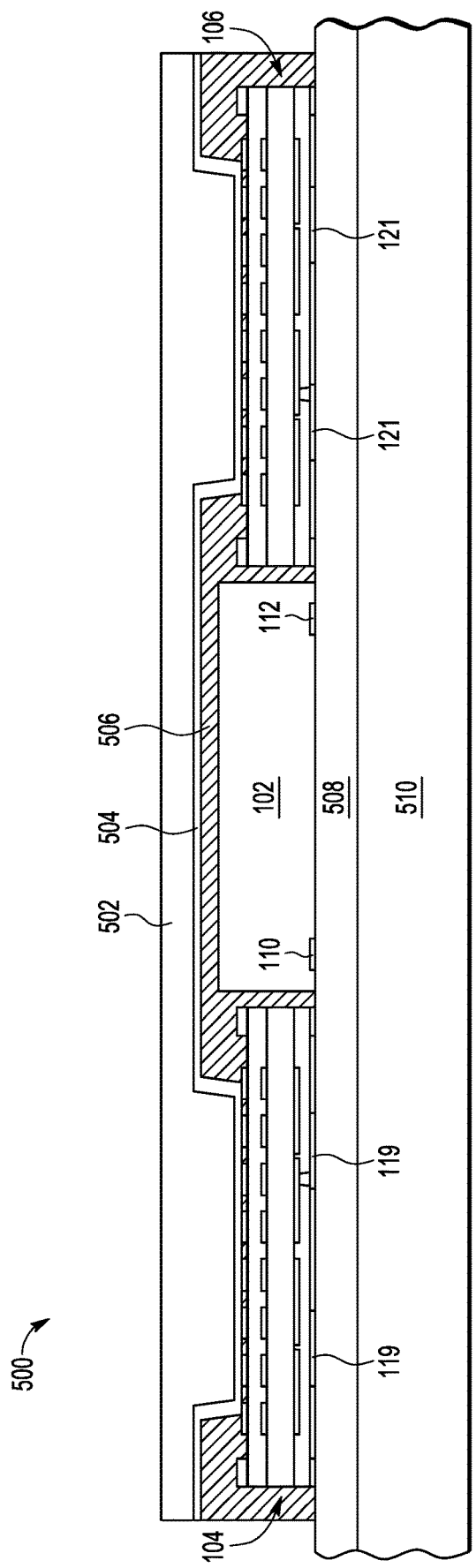
FIGS. 5-8 illustrate, in a simplified cross-sectional view, an example packaged semiconductor device having an alternative substrate structure at various stages of manufacture in accordance with an embodiment.

FIG. 5 illustrates, in a simplified cross-sectional view, a stage of manufacture of an alternative packaged semiconductor device 500, including a partially encapsulated assembly. At this stage, semiconductor die 102 and antennas 104-106 are configured to form an assembly on a carrier 510 and partially encapsulated with an encapsulant (e.g., molding compound) using a FAM process. Semiconductor die 102 is placed active surface face down at a first region of an adhesive layer 508 on the carrier 510 and antennas 104-106 are placed first major surface face down at a second and a third region respectively of the adhesive layer 508 on the carrier 510. After placement of semiconductor die 102 and antennas 104-106, FAM tool 502 is in contact with a conformal structure (e.g., film) 504 over the assembly formed by the semiconductor die 102 and antennas 104-106 on adhesive layer 508 on the carrier 510. The conformal structure 504 conforms with the shape of the FAM tool 502 and contacts predetermined portions of the second major surfaces of antennas 104-106. The encapsulant 506 is formed by substantially encapsulating the assembly with a molding compound, leaving the predetermined portions contacted by conformal structure exposed (e.g., not encapsulated). Bond pads 110-112 of the semiconductor die 102 and terminals 119 and 121 of antennas 104-106 will be connected to conductive ball connectors by way of a build-up substrate formed at a later stage of manufacture.

Figure 6:
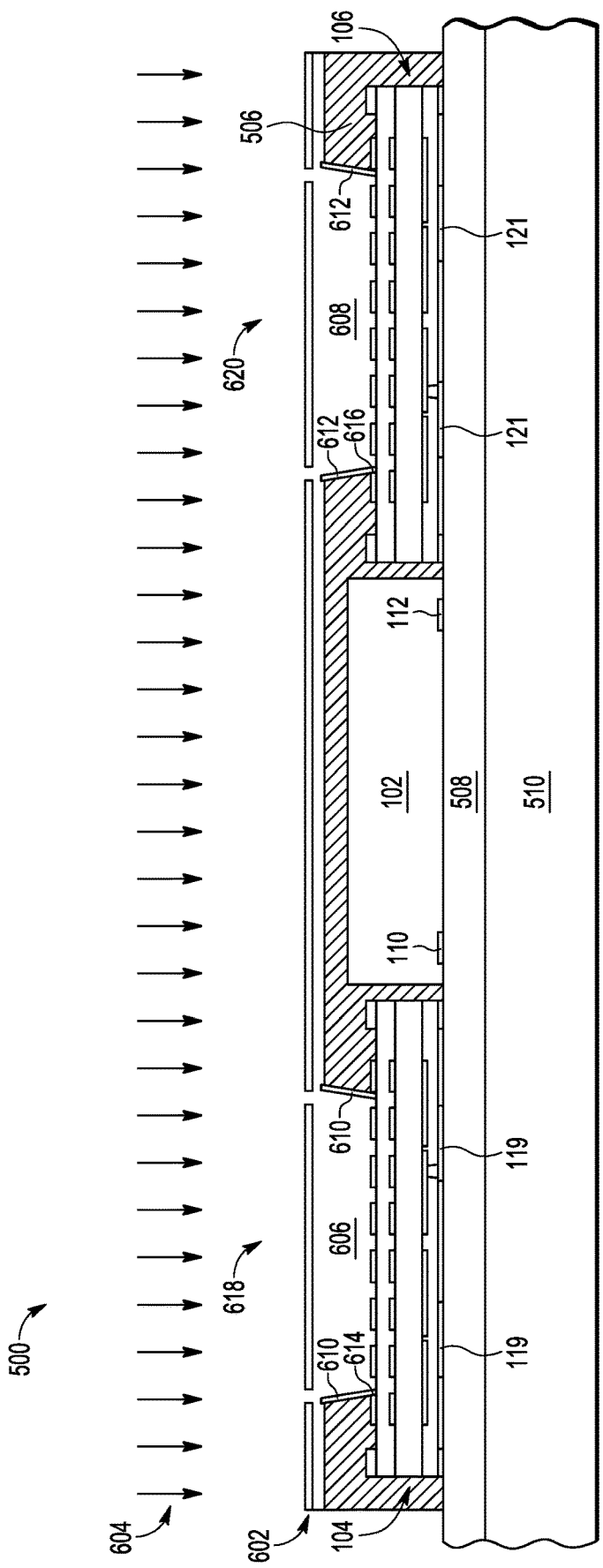

FIG. 6 illustrates, in a simplified cross-sectional view, a subsequent stage of manufacture of packaged semiconductor device 500, including the partially encapsulated assembly of FIG. 5. At this stage, the conformal structure is removed forming air cavities 606-608 configured as waveguides 618-620 above exposed portions of the second major surfaces of antennas 104-106. Air cavities 606-608 dimensions (e.g., width, length) may be configured for propagation of signals having desired wavelengths. A conductive (e.g., metal) layer is formed on sidewalls 610 of air cavity 606 and sidewalls 612 of air cavity 608. The conductive layer formed on sidewalls 610-612 is coupled to supply terminals (e.g., ground supply or other voltage supply) of the antennas 104-106 at junctions 614-616. In this embodiment, a photolithographic process is employed using a mask 602 to isolate sidewalls of air cavities 606-608 and a deposition process is employed to sputter deposit 604 a conductive coating on the isolated sidewalls. In other embodiments, other techniques may be employed to form a conductive coating or layer on sidewalls of cavities 606-608.

Figure 7:
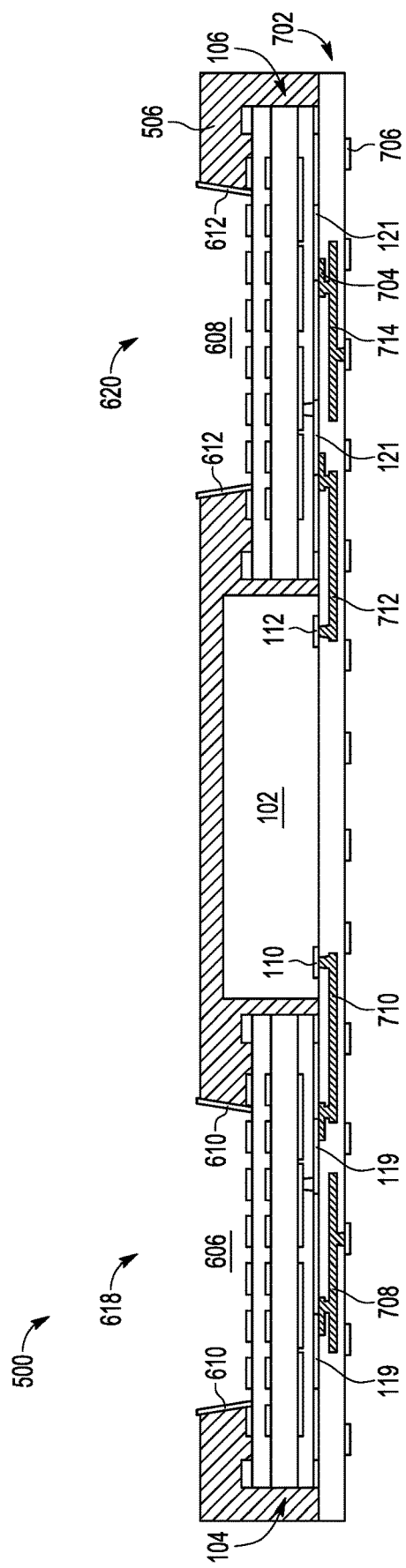

FIG. 7 illustrates, in a simplified cross-sectional view, a subsequent stage of manufacture of packaged semiconductor device 500, including the partially encapsulated assembly of FIG. 6 with build-up substrate 702. At this stage, substrate 702 is formed by way of a build-up process in which insulating and conductive layers are patterned and successively built-up to form an interconnecting redistribution layer. The semiconductor die 102 is interconnected to antennas 104-106 by way of substrate 702 completing the assembly. The build-up substrate 702 includes bond terminal pads 704 formed on a first major surface, ball terminal pads 706 formed on a second major surface, and conductive traces 708-714 interconnecting bond terminal pads 704 and ball terminal pads 706. Bond terminal pads 704 form electrical connections with bond pads 110-112 of the semiconductor die 102 and terminals 119 and 121 of antennas 104-106.

Figure 8:
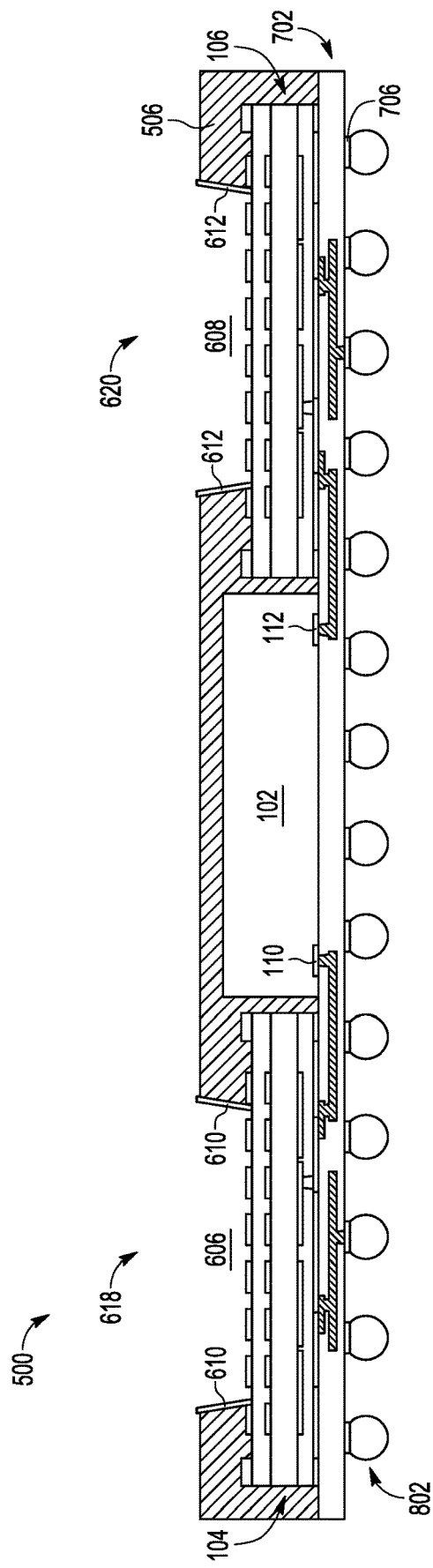

FIG. 8 illustrates, in a simplified cross-sectional view, a subsequent stage of manufacture of packaged semiconductor device 500, including attached conductive ball connectors (e.g., solder balls) 802. At this stage of manufacture, ball connectors 802 are affixed at ball terminal pads 706 using known techniques and materials. Alternatively, ball connectors 802 may be any suitable conductive structure such as gold studs, copper pillars, and the like, to electrically connect conductive features of packaged semiconductor device 500 with a printed circuit board, for example.

Figure 9:
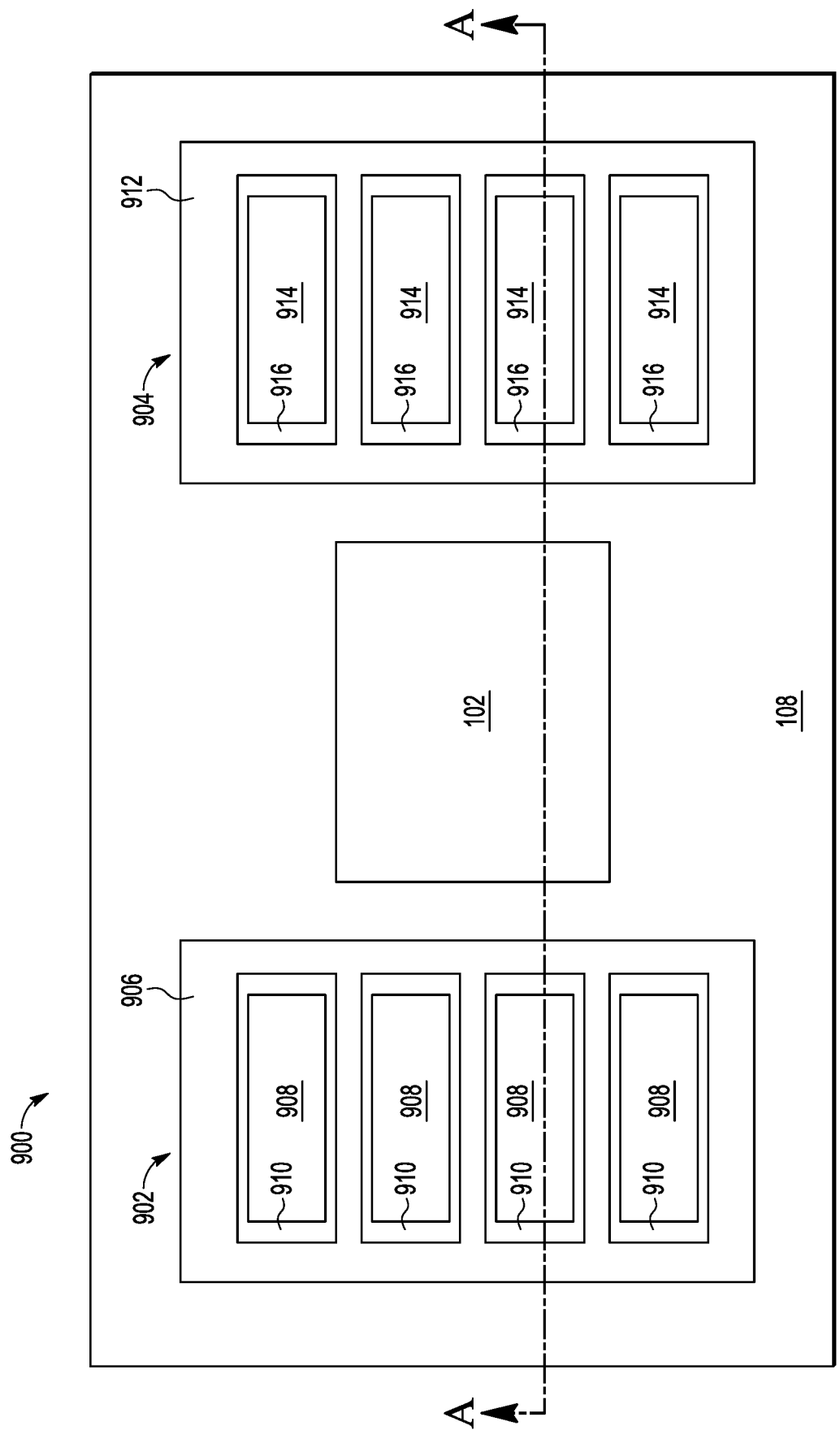
FIG. 9 illustrates, in a plan view, an example packaged semiconductor device with extended waveguide structures at a stage of manufacture in accordance with an embodiment.
Figure 10:
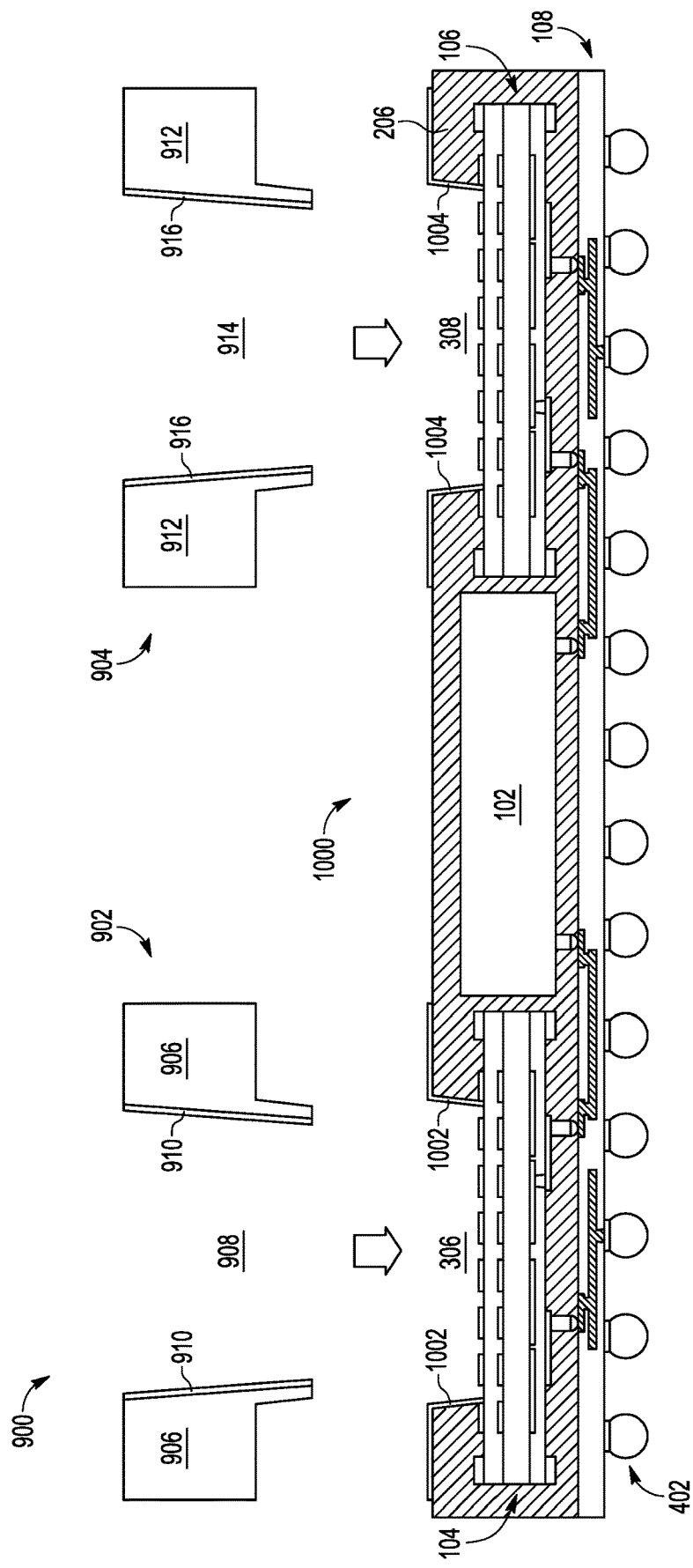
FIGS. 10-11 illustrate, in a simplified cross-sectional view, the example packaged semiconductor device of FIG. 9 along line A-A at stages of manufacture in accordance with an embodiment.
Figure 11:
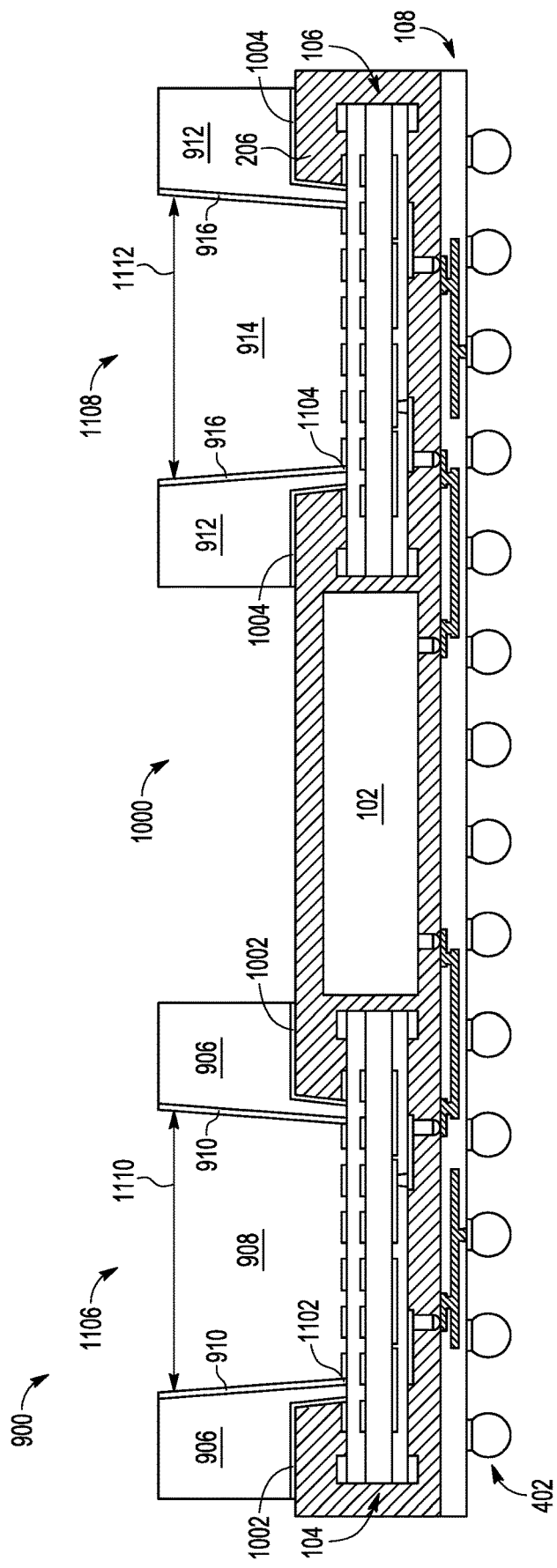

FIGS. 9-11 illustrate, in plan and cross-sectional views, an example packaged semiconductor device 900 with extended waveguide structures 902-904 at various stages of manufacture in accordance with an embodiment.

FIG. 9 illustrates, in a plan view, an example packaged semiconductor device 900 with extended waveguide structures 902-904 at a stage of manufacture in accordance with an embodiment. Shown are extended waveguide structures 902-904 positioned over partially encapsulated assembly as depicted in the stage of manufacture of FIG. 4. Here, semiconductor die 102 is affixed to substrate 108 (encapsulant 206 and antennas 104-106 are not shown to simplify illustration). A cross-sectional view of packaged semiconductor device 900 with extended waveguide structures 902-904 taken along line A-A is shown in FIG. 10.

Extended waveguide structures 902-904 include one or more air cavities 908 and 914 formed in respective rigid portions (e.g., cured molding compound) 906 and 912. In this embodiment, the one or more cavities 908 and 914 are formed in molding compound portions 906 and 912 by way of an injection molding process. A conductive (e.g., metal) layer is formed on sidewalls 910 and 916 of each of the one or more air cavities 908 and 914. At a subsequent stage, the conductive layer formed on sidewalls 910 and 916 is coupled to supply terminals (e.g., ground supply or other voltage supply) of the antennas 104-106.

FIG. 10 illustrates, in a simplified cross-sectional view, the example packaged semiconductor device of FIG. 9 along line A-A at a stage of manufacture in accordance with an embodiment. At this stage of manufacture, packaged semiconductor device 900 includes extended waveguide structures 902-904 positioned over the partially encapsulated assembly 1000 having ball connectors 402 as depicted in FIG. 4. It should be noted that the deposition step (e.g., conductive layer on sidewalls 310-312) depicted in FIG. 3 may be omitted when packaged semiconductor device 900 is configured with extend waveguide structures 902-904. Adhesive 1002-1004 is applied to sidewalls and shoulders of respective air cavities 306-308. The adhesive 1002-1004 may be dispensed or applied as a film, and may be conductive.

FIG. 11 illustrates, in a simplified cross-sectional view, the example packaged semiconductor device of FIG. 9 along line A-A at a subsequent stage of manufacture in accordance with an embodiment. At this stage, packaged semiconductor device 900 includes extended waveguide structures 902-904 affixed to the partially encapsulated assembly 1000. The conductive layer formed on sidewalls 910 and 916 of air cavities 908 and 914 is coupled to supply terminals (e.g., ground supply or other voltage supply) of the antennas 104-106 at junctions 1102-1104. In some embodiments, adhesive 1002-1004 may be a conductive adhesive extended to junctions 1102-1104 to couple the conductive layer formed on sidewalls 910 and 916 to the supply terminals of the antennas 104-106.

With the extended waveguide structures 902-904 affixed to the partially encapsulated assembly 1000, air cavities 908 and 914 are configured as extended waveguides 1106-1108 above exposed portions of the second major surfaces of antennas 104-106. Extended waveguides 1106-1108 dimensions (e.g., width, length) may be configured for propagation of signals (e.g., radar signals) having desired wavelengths. For example, extended waveguide 1106 may be configured for propagation (e.g., transmission) of a radar signal having a frequency of 77 GHz. Because a 77 GHz signal has a wavelength of approximately 4 mm, the extended waveguide 1106 is configured with a width dimension 1110 of approximately 2 mm, or half of the desired wavelength.

Figure 12:
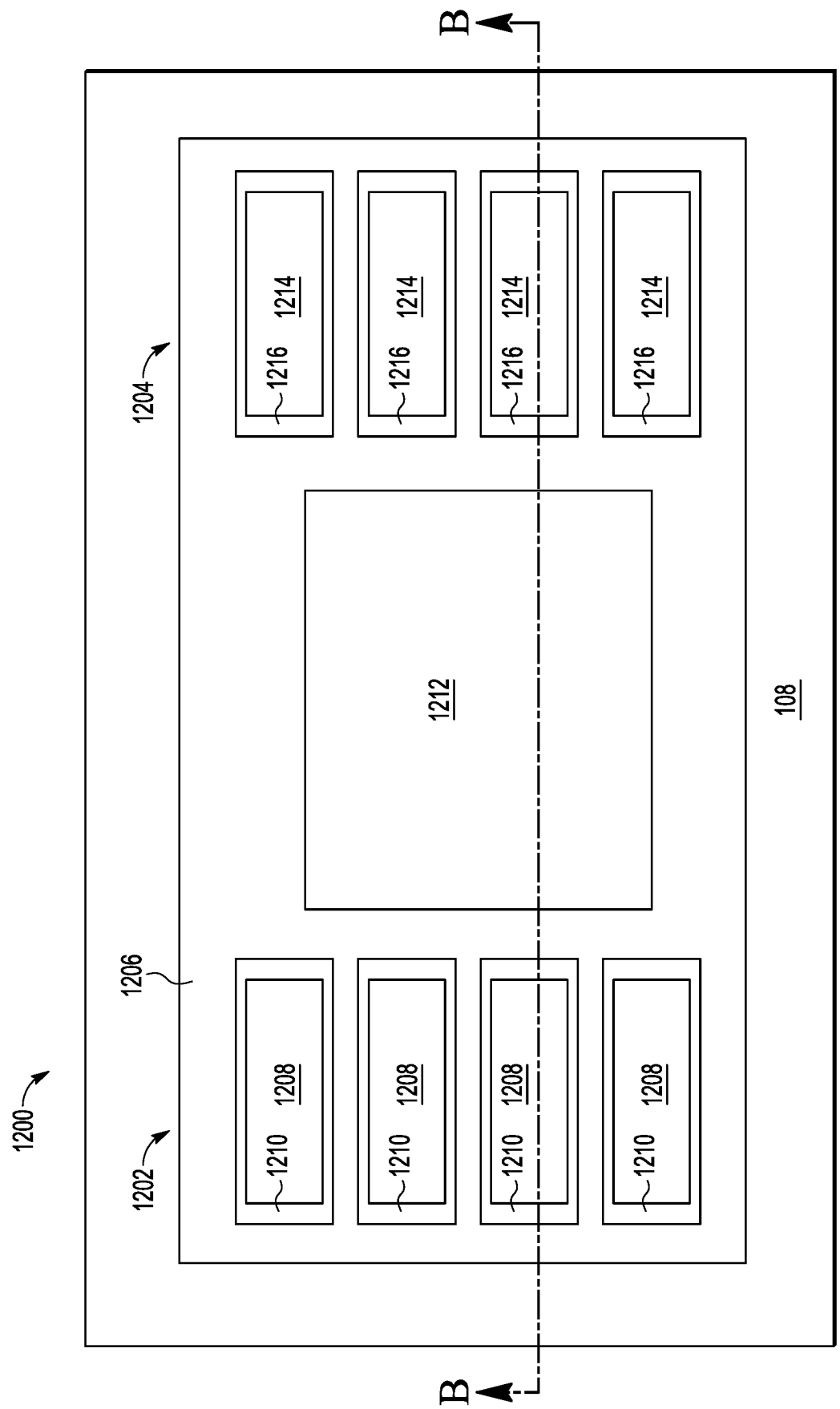
FIG. 12 illustrates, in a plan view, an example packaged semiconductor device with extended waveguide structure and heat spreader at a stage of manufacture in accordance with an embodiment.
Figure 13:
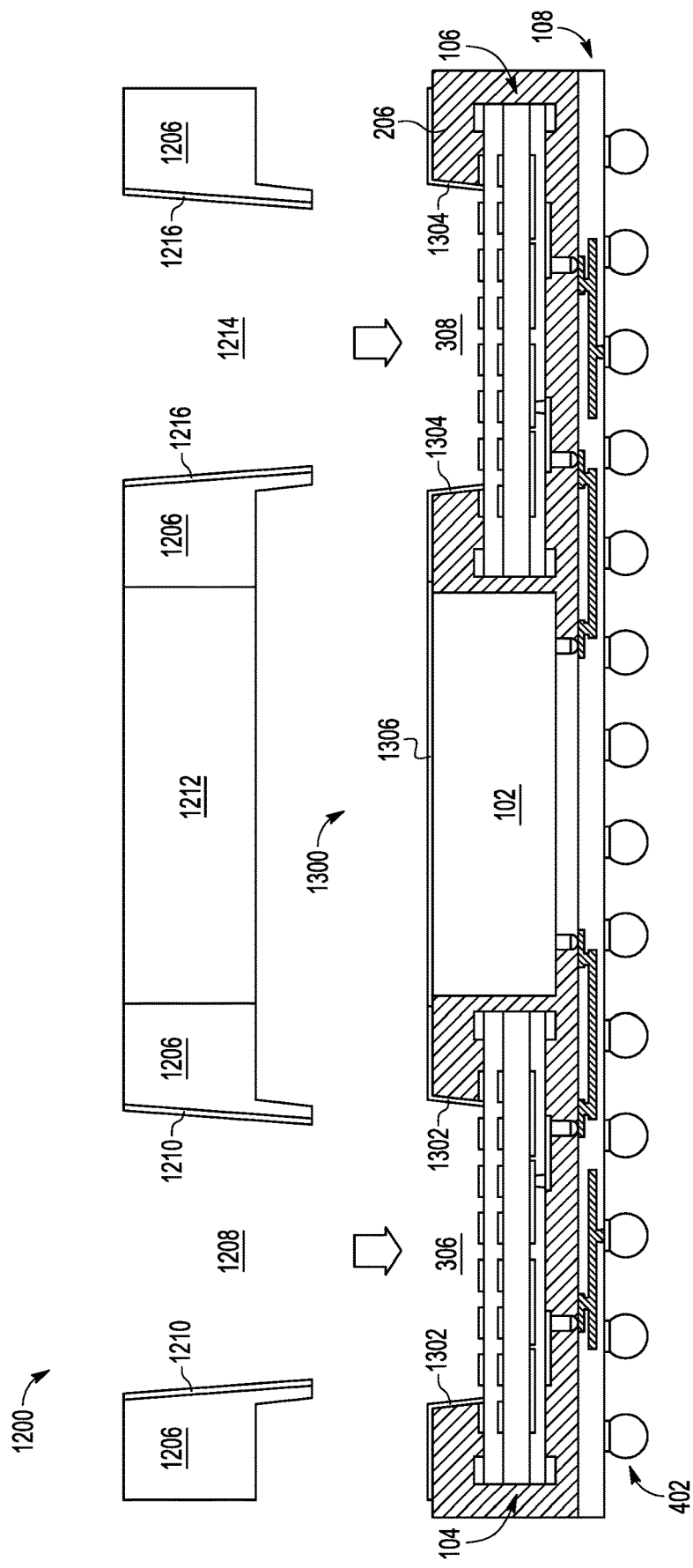
FIGS. 13-14 illustrate, in a simplified cross-sectional view, the example packaged semiconductor device of FIG. 12 along line B-B at stages of manufacture in accordance with an embodiment.
Figure 14:
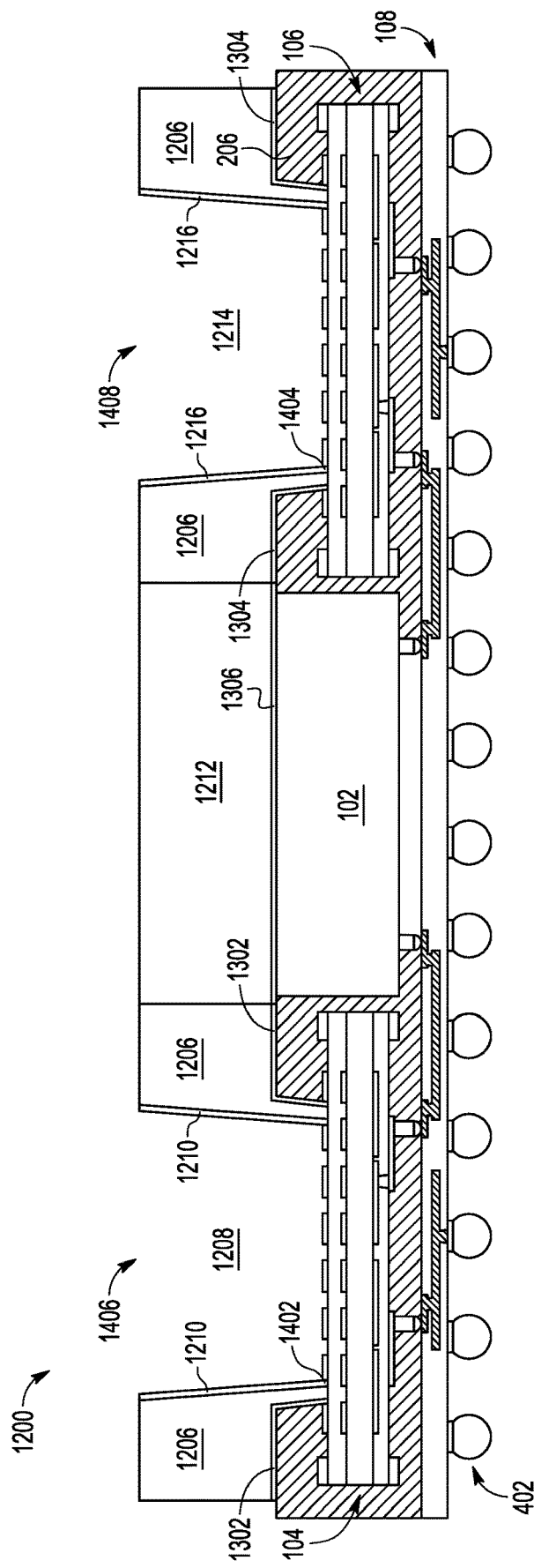

FIGS. 12-14 illustrate, in plan and cross-sectional views, an example packaged semiconductor device 1200 with extended waveguide structures 1202-1204 and heat spreader 1212 at various stages of manufacture in accordance with an embodiment.

FIG. 12 illustrates, in a plan view, an example packaged semiconductor device 1200 with extended waveguide structures 1202-1204 and heat spreader 1212 at a stage of manufacture in accordance with an embodiment. Shown are extended waveguide structures 1202-1204 and heat spreader 1212 positioned over partially encapsulated assembly consistent with the stage of manufacture of FIG. 4. Here, semiconductor die 102 (not shown) is affixed to substrate 108 (encapsulant 206 and antennas 104-106 are not shown to simplify illustration). A cross-sectional view of packaged semiconductor device 1200 with extended waveguide structures 1202-1204 and heat spreader 1212 taken along line B-B is shown in FIG. 13.

Extended waveguide structures 1202-1204 include one or more air cavities 1208 and 1214 formed in rigid portion (e.g., cured molding compound) 1206. In this embodiment, the one or more cavities 1208 and 1214 are formed in a molding compound portion 1206 by way of an injection molding process. A conductive (e.g., metal) layer is formed on sidewalls 1210 and 1216 of each of the one or more air cavities 1208 and 1214. At a subsequent stage, the conductive layer formed on sidewalls 1210 and 1216 is coupled to terminals (e.g., ground or other voltage supply) of the antennas 104-106 and a major surface of the heat spreader 1212 is in thermal contact (e.g., by way of thermal interface material) with the backside surface of semiconductor die 102.

The heat spreader 1212 is formed or pressed-fit in rigid portion 1206. In this embodiment, the heat spreader 1212 is at least partially encapsulated in molding compound portion 1206 by way of an injection molding process. The heat spreader 1212 may be referred to as a flange, heatsink, or embedded coin configured for dissipating heat. Heat spreader 1212 may be formed from copper, silver, aluminum, gold, other conductive materials, or combinations and alloys thereof. In some embodiments, heat spreader 1212 may be formed from a composite of multiple layers of conductive materials.

FIG. 13 illustrates, in a simplified cross-sectional view, the example packaged semiconductor device of FIG. 12 along line B-B at a stage of manufacture in accordance with an embodiment. At this stage of manufacture, packaged semiconductor device 1200 includes extended waveguide structures 1202-1204 and heat spreader 1212 positioned over the partially encapsulated assembly 1300 having ball connectors 402 as depicted in FIG. 4. In this embodiment, the backside surface of semiconductor die 102 is exposed after the encapsulation step depicted in FIG. 2. For example, semiconductor die 102 may be formed to have a greater thickness such that the conformal structure 204 contacts the backside surface of semiconductor die 102 in addition to the predetermined portions of the second major surfaces of antennas 104-106. It should be noted that the deposition step (e.g., conductive layer on sidewalls 310-312) depicted in FIG. 3 may be omitted when packaged semiconductor device 1200 is configured with extended waveguide structures 1202-1204. Adhesive 1302-1304 is applied to sidewalls and shoulders of respective air cavities 306-308 and a thermal interface (e.g., thermally conductive) material 1306 is applied to the backside surface of semiconductor die 102. The adhesive 1302-1304 and thermal interface material 1306 may be dispensed or applied as a film. The adhesive 1302-1304 and thermal interface material 1306 may be formed from the same material having both adhesive and thermal conduction properties.

FIG. 14 illustrates, in a simplified cross-sectional view, the example packaged semiconductor device of FIG. 9 along line A-A at a subsequent stage of manufacture in accordance with an embodiment. At this stage, packaged semiconductor device 1200 includes extended waveguide structures (1202-1204) and heat spreader 1212 affixed to the partially encapsulated assembly (1300). The conductive layer formed on sidewalls 1210 and 1216 of air cavities 1208 and 1214 is coupled to supply terminals (e.g., ground supply or other voltage supply) of the antennas 104-106 at junctions 1402-1404. In some embodiments, adhesive 1302-1304 may be a conductive adhesive extended to junctions 1402-1404 to couple the conductive layer formed on sidewalls 1210 and 1216 to the supply terminals of the antennas 104-106.

With the extended waveguide structures affixed to the partially encapsulated assembly, air cavities 1208 and 1214 are configured as extended waveguides 1406-1408 above exposed portions of the second major surfaces of antennas 104-106. Extended waveguides 1406-1408 dimensions (e.g., width, length) may be configured for propagation of signals (e.g., radar signals) having desired wavelengths. For example, extended waveguide 1406 may be configured for propagation (e.g., transmission) of a radar signal having a frequency of 77 GHz. Because a 77 GHz signal has a wavelength of approximately 4 mm, the extended waveguide 1106 is configured having a width dimension of approximately 2 mm, or half of the desired wavelength.

Generally, there is provided, a method of manufacturing a packaged semiconductor device including forming an assembly by coupling a semiconductor die and an antenna by way of a substrate; contacting with a conformal structure at least a portion of a first surface of the antenna; and encapsulating the assembly with a molding compound, the at least a portion of the first surface of the antenna contacted by the conformal structure not encapsulated with molding compound. The method may further include removing the conformal structure forming an air cavity configured as a waveguide above an exposed portion of the first surface of the antenna. The method may further include forming a conductive layer on sidewalls of the air cavity, the conductive layer coupled to a ground supply terminal of the antenna. The waveguide dimensions may be configured for propagation of a 77 GHz signal. The method may further include providing an extended waveguide structure having an extended air cavity; and attaching the extended waveguide structure to at least a portion of a top surface of the encapsulated assembly, the extended air cavity arranged coincident with the air cavity such that an extended waveguide is formed above the exposed portion of the first surface of the antenna. Providing the extended waveguide structure may further include forming the extended waveguide structure by way of an injection mold process, the extended waveguide structure comprising a mold compound material surrounding the extended air cavity; forming a conductive layer on sidewalls of the extended air cavity; and coupling the conductive layer to a ground supply terminal of the antenna structure when the extended waveguide structure is attached to the at least a portion of the top surface of the encapsulated assembly. The extended waveguide structure may include a heat spreader, the heat spreader in thermal contact with a backside of the semiconductor die when the extended waveguide structure is attached to the at least a portion of the top surface of the encapsulated assembly. The substrate may be a pre-formed or a built-up substrate including a redistribution layer to couple the semiconductor die and the antenna. The method may further include affixing solder balls at a bottom side of the substrate for electrical connection with a printed circuit board.

In another embodiment, there is provided, a packaged semiconductor device including an assembly including a semiconductor die having an active surface and a backside surface; an antenna having a first major surface and a second major surface; and a substrate configured to electrically couple a bond pad on the active surface of the semiconductor die with a terminal on the first major surface of the antenna; an encapsulant encapsulating a portion of the assembly; and an air cavity formed in the encapsulant exposing at least a portion of the second major surface of the antenna. The air cavity may be formed by way of a film-assisted molding process. The substrate may be a pre-formed or a built-up substrate including a redistribution layer to couple the bond pad on the active surface of the semiconductor die with the terminal on the first major surface of the antenna. The packaged semiconductor device may further include a conductive layer formed on sidewalls of the air cavity, the conductive layer coupled to a ground supply terminal of the antenna. The packaged semiconductor device may further include an extended waveguide structure attached to at least a portion of a top surface of the encapsulated assembly, the extended waveguide structure comprising an extended air cavity arranged coincident with the air cavity such that an extended waveguide is formed above the exposed portion of the second major surface of the antenna. The extended waveguide structure may be formed by way of an injection mold process, the extended waveguide structure comprising a mold compound material surrounding the extended air cavity. The extended air cavity may have a width dimension of approximately 2 millimeters and may be configured for 77 GHz operation. The extended waveguide structure may further include a heat spreader arranged coincident with the semiconductor die, the heat spreader in thermal contact with the backside surface of the semiconductor die.

In yet another embodiment, there is provided, a method of manufacturing a packaged semiconductor device including forming an assembly by coupling a semiconductor die and an antenna by way of a substrate; contacting with a conformal structure at least a portion of a first surface of the antenna; and encapsulating the assembly with an encapsulant such that an air cavity is formed in the encapsulant exposing the at least a portion of the first surface of the antenna. The substrate may be a pre-formed or a built-up substrate including a redistribution layer to couple a bond pad on an active surface of the semiconductor die with a terminal on a second surface of the antenna. The method may further include attaching an extended waveguide structure to at least a portion of a top surface of the encapsulated assembly, the extended waveguide structure including an extended air cavity arranged coincident with the air cavity such that an extended waveguide is formed above the exposed portion of the first surface of the antenna.

By now, it should be appreciated that a packaged semiconductor device with integrated waveguide. An assembly formed with a semiconductor die coupled to an antenna by way of a substrate is partially encapsulated with an encapsulant. An air cavity in the encapsulant formed above the antenna is configured as a waveguide allowing for efficient propagation (e.g., transmit and/or receive) of radar (e.g., wwWave) signals. The waveguide can be augmented with an extended waveguide structure proving greater tuning capabilities for transmitting/receiving the radar signals. By integrating the waveguide into/onto the package, required application circuit board space is minimized and overall costs are significantly reduced.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of manufacturing a packaged semiconductor device, the method comprising:
   forming an assembly by coupling a semiconductor die and an antenna by way of a substrate;
   contacting with a conformal structure at least a portion of a first surface of the antenna; and
   encapsulating the assembly with an encapsulant, the at least a portion of the first surface of the antenna contacted by the conformal structure not encapsulated with the encapsulant.

2. The method of claim 1, further comprising removing the conformal structure forming an air cavity configured as a waveguide above an exposed portion of the first surface of the antenna.

3. The method of claim 2, further comprising forming a conductive layer on sidewalls of the air cavity, the conductive layer coupled to a ground supply terminal of the antenna.

4. The method of claim 2, wherein the waveguide dimensions are configured for propagation of a 77 GHz signal.

5. The method of claim 2, further comprising:
   providing an extended waveguide structure having an extended air cavity; and
   attaching the extended waveguide structure to at least a portion of a top surface of the encapsulated assembly, the extended air cavity arranged coincident with the air cavity such that an extended waveguide is formed above the exposed portion of the first surface of the antenna.

6. The method of claim 5, wherein providing the extended waveguide structure further comprises:
   forming the extended waveguide structure by way of an injection mold process, the extended waveguide structure comprising a mold compound material surrounding the extended air cavity;
   forming a conductive layer on sidewalls of the extended air cavity; and
   coupling the conductive layer to a ground supply terminal of the antenna structure when the extended waveguide structure is attached to the at least a portion of the top surface of the encapsulated assembly.

7. The method of claim 5, wherein the extended waveguide structure includes a heat spreader, the heat spreader in thermal contact with a backside of the semiconductor die when the extended waveguide structure is attached to the at least a portion of the top surface of the encapsulated assembly.

8. The method of claim 1, wherein the substrate is a pre-formed or a built-up substrate comprising a redistribution layer to couple the semiconductor die and the antenna.

9. The method of claim 1, further comprising affixing solder balls at a bottom side of the substrate for electrical connection with a printed circuit board.

10. A packaged semiconductor device comprising:
    an assembly including:
      a semiconductor die having an active surface and a backside surface;
      an antenna having a first major surface and a second major surface; and
      a substrate configured to electrically couple a bond pad on the active surface of the semiconductor die with a terminal on the first major surface of the antenna;
    an encapsulant encapsulating a portion of the assembly; and
    an air cavity formed in the encapsulant exposing at least a portion of the second major surface of the antenna.

11. The packaged semiconductor device of claim 10, wherein the air cavity is formed by way of a film-assisted molding process.

12. The packaged semiconductor device of claim 10, wherein the substrate is a pre-formed or a built-up substrate comprising a redistribution layer to couple the bond pad on the active surface of the semiconductor die with the terminal on the first major surface of the antenna.

13. The packaged semiconductor device of claim 10, further comprising a conductive layer formed on sidewalls of the air cavity, the conductive layer coupled to a ground supply terminal of the antenna.

14. The packaged semiconductor device of claim 10, further comprising an extended waveguide structure attached to at least a portion of a top surface of the encapsulated assembly, the extended waveguide structure comprising an extended air cavity arranged coincident with the air cavity such that an extended waveguide is formed above the exposed portion of the second major surface of the antenna.

15. The packaged semiconductor device of claim 14, wherein the extended waveguide structure is formed by way of an injection mold process, the extended waveguide structure comprising a mold compound material surrounding the extended air cavity.

16. The packaged semiconductor device of claim 14, wherein the extended air cavity has a width dimension of approximately 2 millimeters and is configured for 77 GHz operation.

17. The packaged semiconductor device of claim 14, wherein the extended waveguide structure further comprises a heat spreader arranged coincident with the semiconductor die, the heat spreader in thermal contact with the backside surface of the semiconductor die.

18. A method of manufacturing a packaged semiconductor device, the method comprising:

forming an assembly by coupling a semiconductor die and an antenna by way of a substrate;

contacting with a conformal structure at least a portion of a first surface of the antenna; and encapsulating the assembly with an encapsulant such that an air cavity is formed in the encapsulant exposing the at least a portion of the first surface of the antenna.

19. The method of claim 18, wherein the substrate is a pre-formed or a built-up substrate comprising a redistribution layer to couple a bond pad on an active surface of the semiconductor die with a terminal on a second surface of the antenna.

20. The method of claim 18, further comprising attaching an extended waveguide structure to at least a portion of a top surface of the encapsulated assembly, the extended waveguide structure including an extended air cavity arranged coincident with the air cavity such that an extended waveguide is formed above the exposed portion of the first surface of the antenna.

\* \* \* \* \*